US012652027B2

(12) United States Patent
Iijima et al.

(10) Patent No.: US 12,652,027 B2
(45) Date of Patent: Jun. 9, 2026

(54) DATA CARRIER APPARATUS, COMMUNICATION SYSTEM, AND REPLACEABLE UNIT

(71) Applicant: Canon Kabushiki Kaisha, Tokyo (JP)

(72) Inventors: Ichiro Iijima, Kanagawa (JP);
Hirotaka Ittogi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 358 days.

(21) Appl. No.: 18/541,152

(22) Filed: Dec. 15, 2023

(65) Prior Publication Data

US 2024/0213962 A1 Jun. 27, 2024

(30) Foreign Application Priority Data

Dec. 21, 2022 (JP) ................................. 2022-204633

(51) Int. Cl.
*H03K 3/017* (2006.01)
*H03K 7/08* (2006.01)
*H04L 7/00* (2006.01)

(52) U.S. Cl.
CPC ............... *H03K 3/017* (2013.01); *H03K 7/08* (2013.01); *H04L 7/0087* (2013.01)

(58) Field of Classification Search
None
See application file for complete search history.

(56) References Cited

U.S. PATENT DOCUMENTS

| | | | |
|---|---|---|---|
| 10,637,699 B2 | 4/2020 | Iijima et al. | |
| 11,743,078 B2 * | 8/2023 | Ittogi | H04L 25/4902 |
| | | | 375/239 |
| 2006/0098691 A1 * | 5/2006 | Yamazaki | H03M 5/04 |
| | | | 370/518 |

FOREIGN PATENT DOCUMENTS

JP 2019103123 A 6/2019

* cited by examiner

*Primary Examiner* — Cassandra F Cox
(74) *Attorney, Agent, or Firm* — Venable LLP

(57) ABSTRACT

In a data carrier apparatus, a first determination unit determines a duty ratio of each pulse of a pulse signal received from a data carrier driving apparatus, and a second determination unit determines a frequency of each pulse of the received pulse signal. A calibration unit performs calibration of a reference value to be used for determination performed by the second determination unit, during a calibration period. A demodulation unit demodulates data conveyed by the received pulse signal. The demodulation unit performs first demodulation based on a determination result of the first determination unit during the calibration period, and it starts second demodulation based on the determination result of the first determination unit and a determination result of the second determination unit when the calibration period ends.

20 Claims, 12 Drawing Sheets

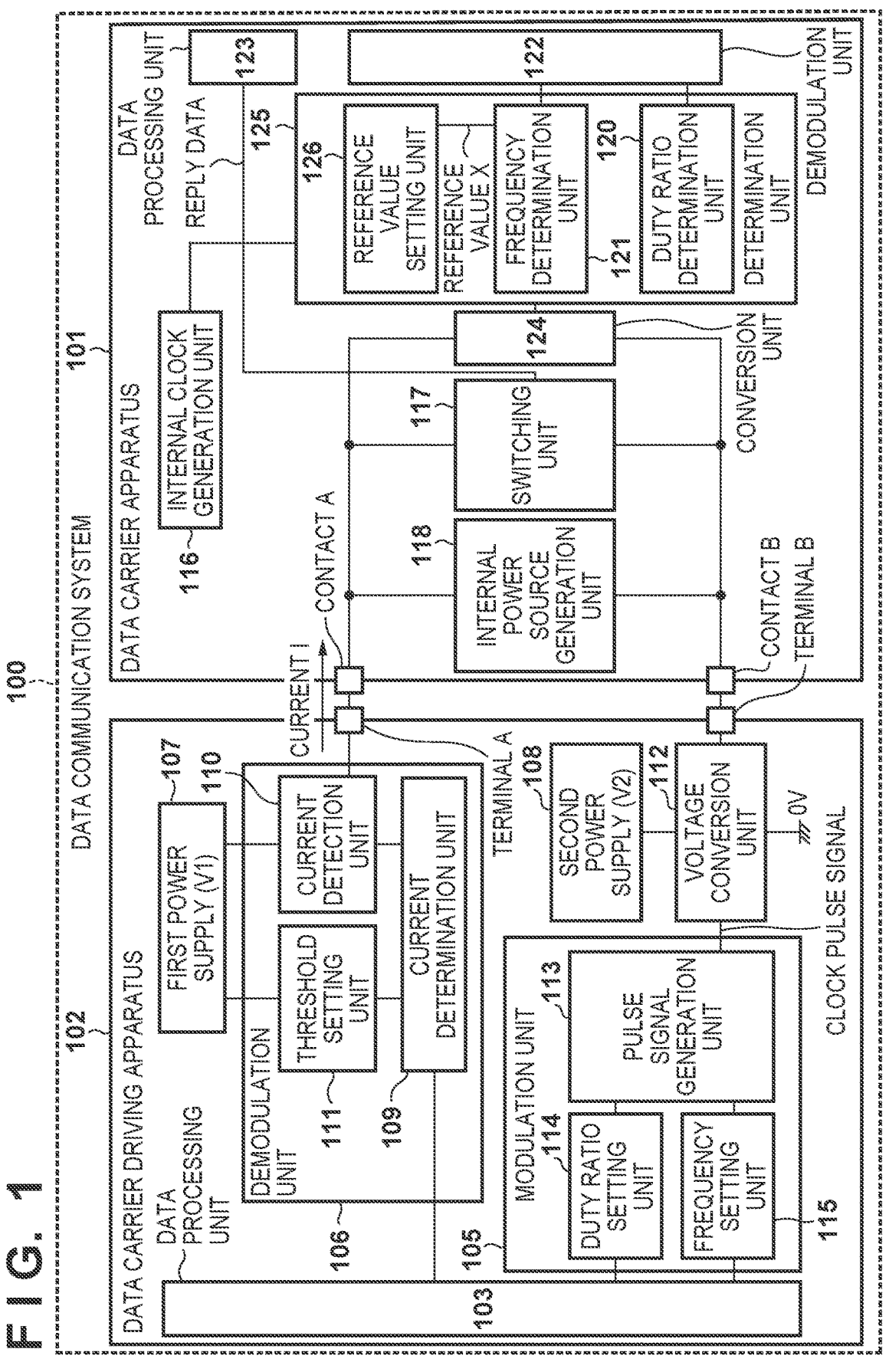
F I G. 1

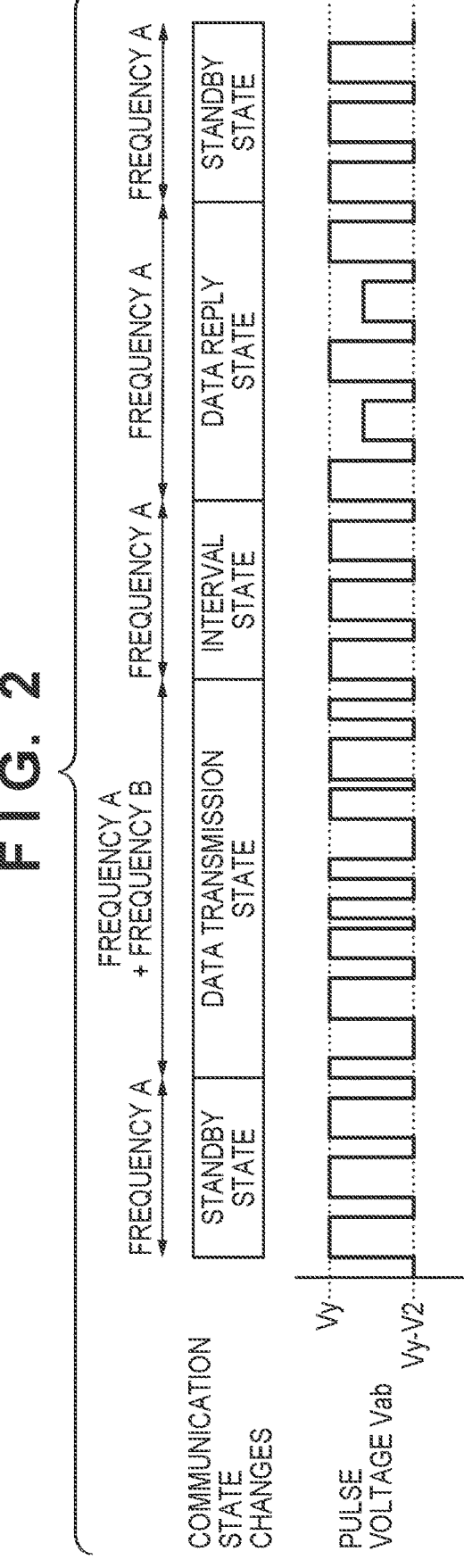
F I G. 2

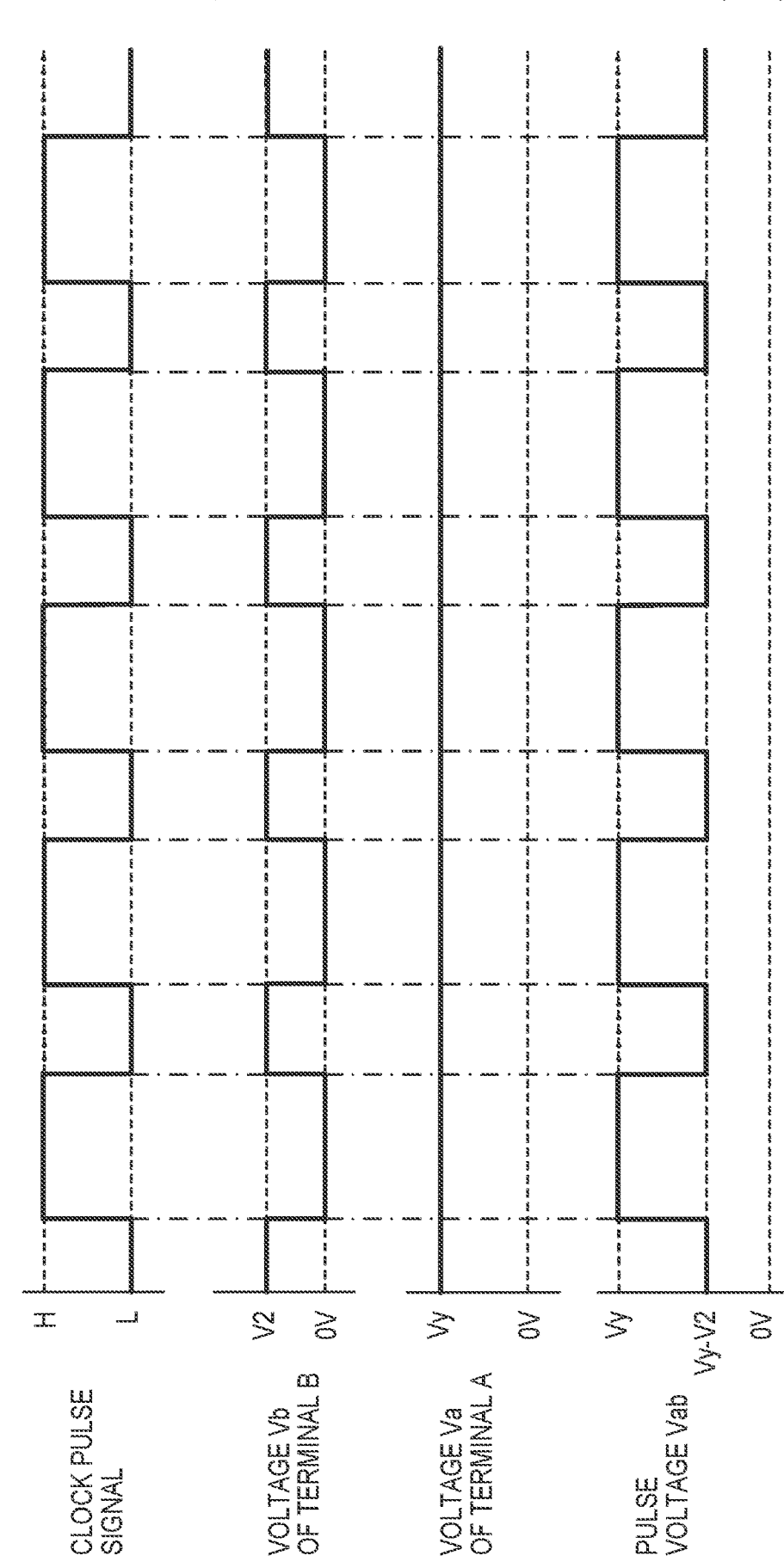
F I G. 3

F I G. 4
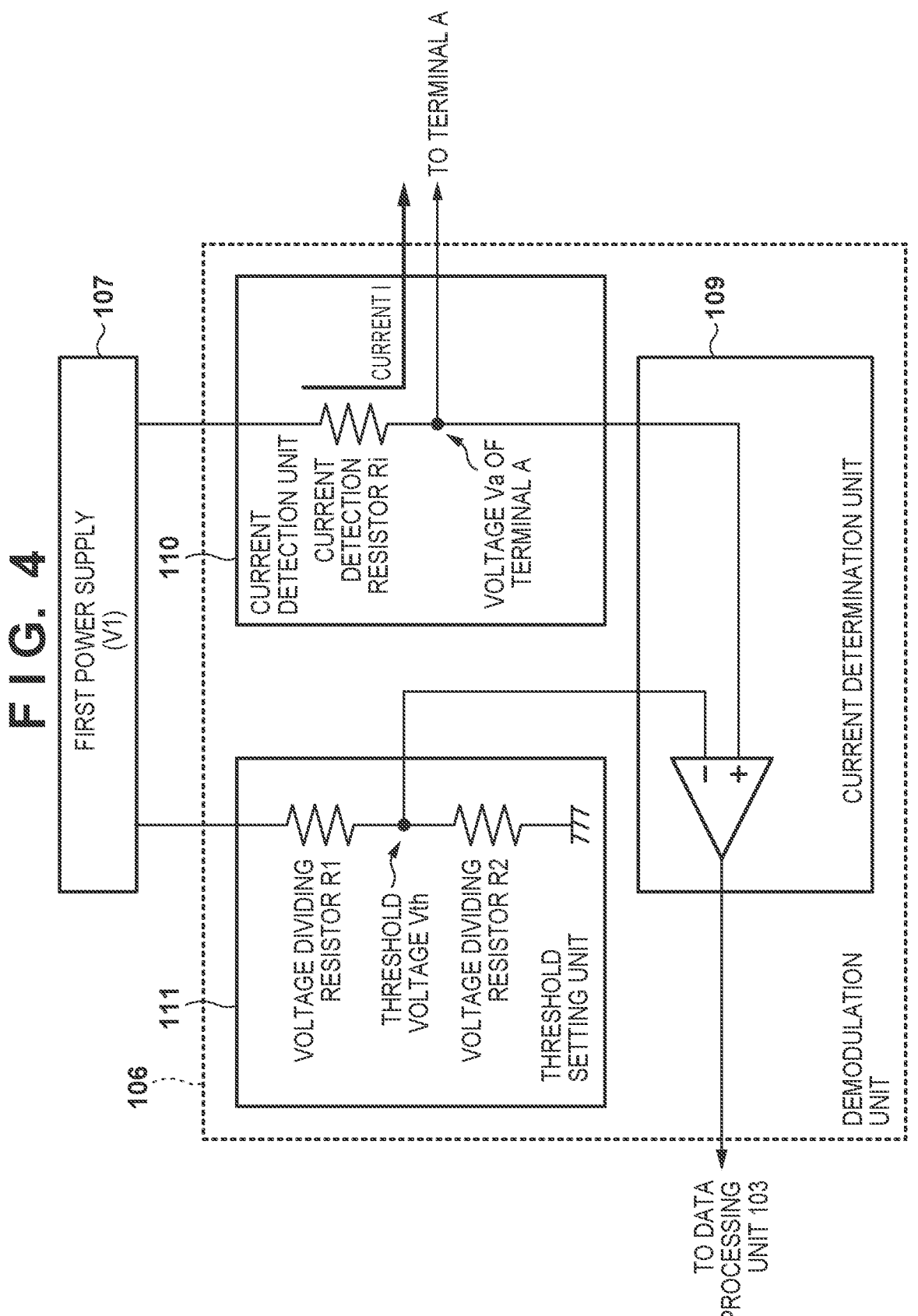

F I G. 5A
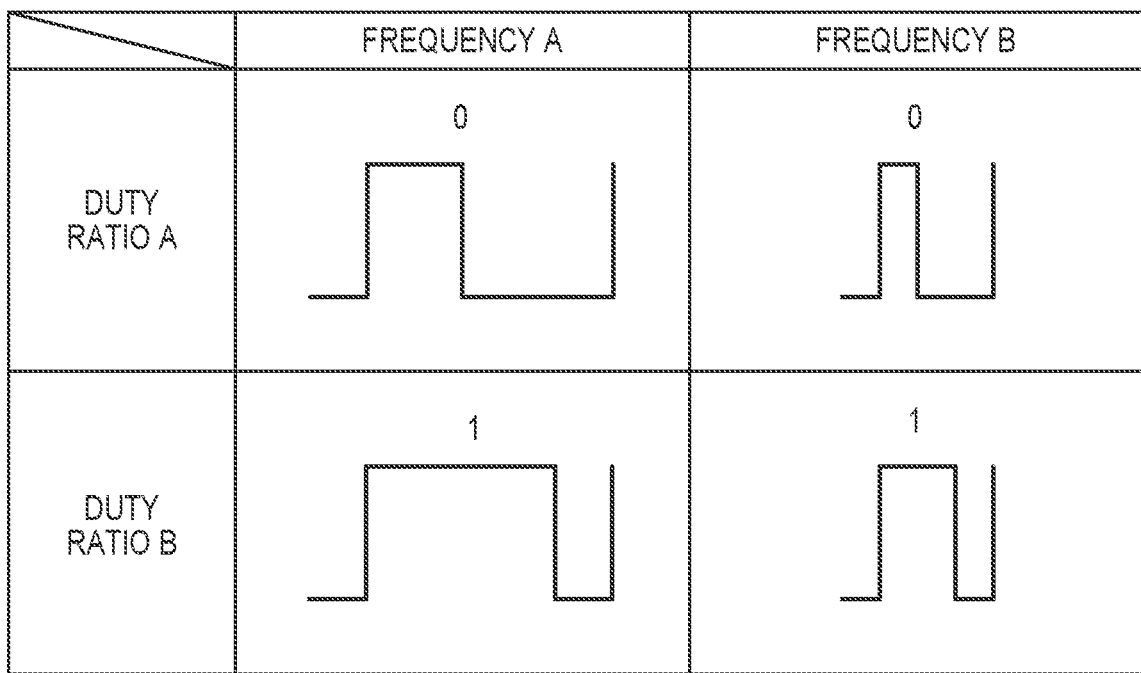
F I G. 5B

FIG. 7

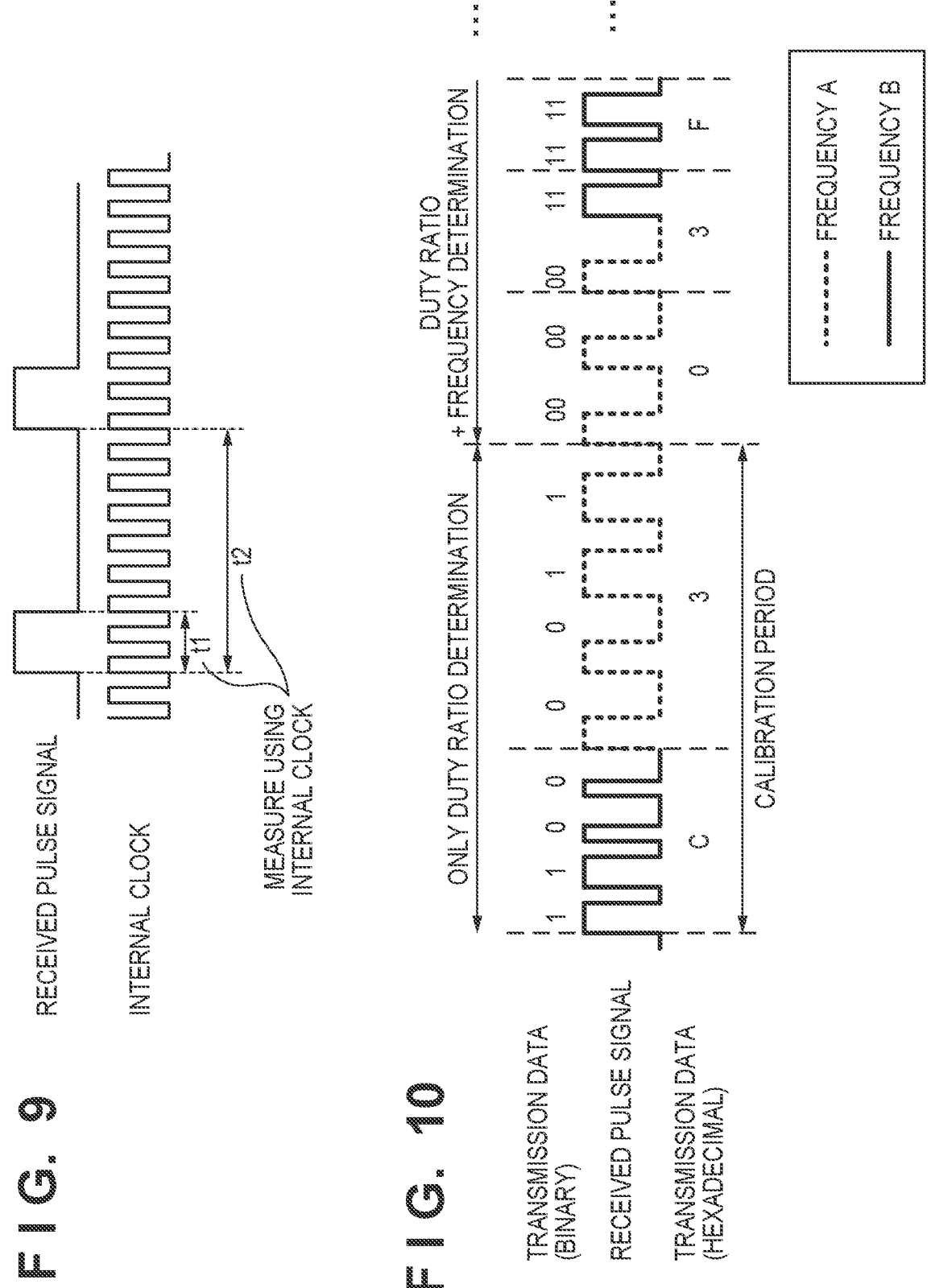
F I G. 9
F I G. 10

F I G. 14
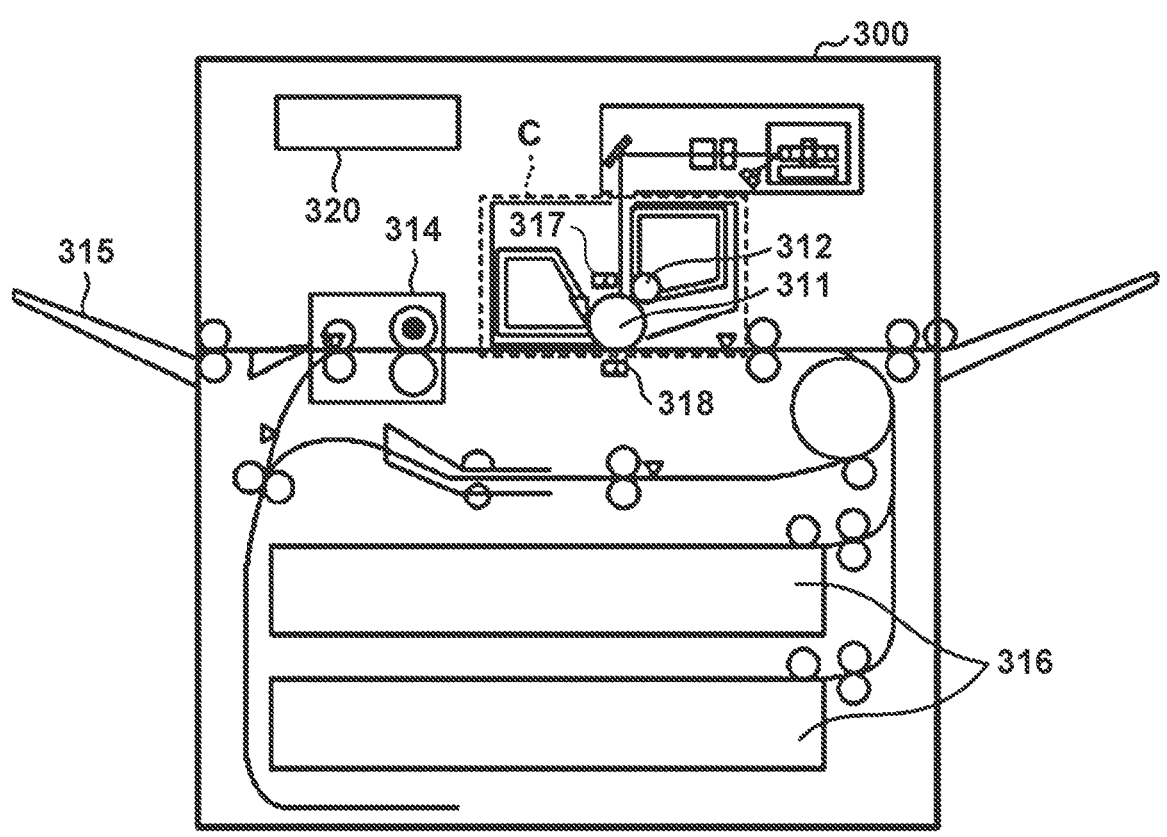
F I G. 15
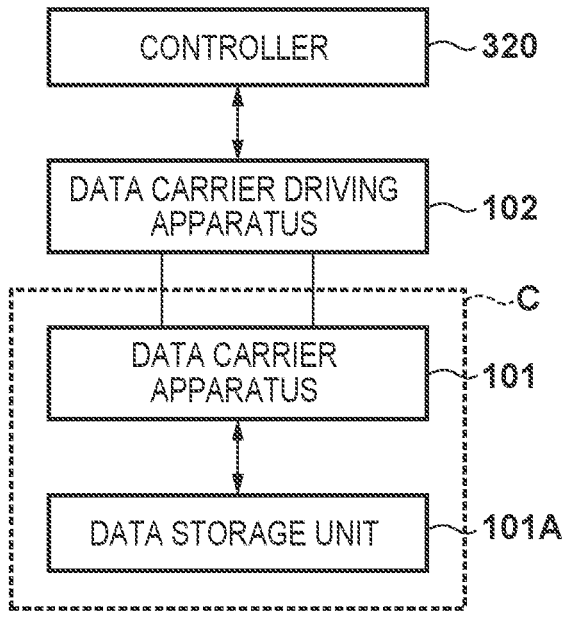

DATA CARRIER APPARATUS, COMMUNICATION SYSTEM, AND REPLACEABLE UNIT

BACKGROUND OF THE INVENTION

Field of the Invention

The present invention relates to a data carrier apparatus, a communication system including a data carrier apparatus and a data carrier driving apparatus, and a replaceable unit, and in particular relates to data communication between a data carrier apparatus and a data carrier driving apparatus.

DESCRIPTION OF THE RELATED ART

As a two-wire communication interface for communicating between two apparatuses, there is a two-wire communication interface in which data communication, power supply, and synchronization signal supply are performed using two communication lines (signal lines). Japanese Patent Laid-Open No. 2019-103123 describes a technique for, in a communication system in which communication is performed using two communication lines, increasing the communication rate by transmitting and receiving data through modulation of the frequency of each pulse of a pulse signal in addition to modulation of the duty ratio of each pulse. In such a communication system, in order to stably determine the frequency of the received pulse signal regardless of the accuracy of the oscillation source (oscillator) used in the receiving communication apparatus, calibration of the reference value for determining the frequency can be performed in the receiving communication apparatus.

The above-mentioned calibration of the reference value for frequency determination can normally be performed before starting data communication between communication apparatuses. In this case, it is necessary to provide a period for executing calibration before starting data communication. This leads to a delay in the start timing of data communication.

SUMMARY OF THE INVENTION

In view of this, the present disclosure provides a technique for starting data communication earlier while realizing stable frequency determination on the receiving side when performing multi-level data communication using a pulse signal whose duty ratio (pulse width) and frequency are modulated.

According to one aspect of the present invention, there is provided a data carrier apparatus capable of communicating with a data carrier driving apparatus, comprising: a first determination unit configured to determine a duty ratio of each pulse of a pulse signal received from the data carrier driving apparatus; a second determination unit configured to determine a frequency of each pulse of the received pulse signal; a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends.

According to another aspect of the present invention, there is provided a replaceable unit that is attachable to an image forming apparatus, comprising: a process member to be used for image formation, a data carrier apparatus capable of communicating with a data carrier driving apparatus provided in the image forming apparatus, when attached to the image forming apparatus, wherein the data carrier apparatus comprises: a first determination unit configured to determine a duty ratio of each pulse of a pulse signal received from the data carrier driving apparatus; a second determination unit configured to determine a frequency of each pulse of the received pulse signal; a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends.

According to still another aspect of the present invention, there is provided a communication system comprising: a data carrier apparatus; and a data carrier driving apparatus to be connected to the data carrier apparatus by two communication lines, wherein the data carrier driving apparatus includes: a modulation unit configured to generate a pulse signal modulated based on data to be transmitted; and a transmission unit configured to transmit the pulse signal generated by the modulation unit to the data carrier apparatus based on a potential difference provided between the two communication lines, the data carrier apparatus comprises: a first determination unit configured to determine a duty ratio of each pulse of a pulse signal received from the data carrier driving apparatus; a second determination unit configured to determine a frequency of each pulse of the received pulse signal; a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends, and the modulation unit generates a pulse signal in which the duty ratio of each pulse is modulated based on data to be transmitted during the calibration period, and the modulation unit starts generation of a pulse signal in which the duty ratio and the frequency of each pulse is modulated based on data to be transmitted when the calibration period ends.

Further features of the present invention will become apparent from the following description of exemplary embodiments (with reference to the attached drawings).

BRIEF DESCRIPTION OF THE DRAWINGS

FIG. 1 shows a configuration example of a data communication system.

FIG. 2 shows an example of change in a communication state of the data communication system and a pulse voltage Vab corresponding to each communication state.

FIG. 3 shows an example of signal waveforms in a data communication system.

FIG. 4 shows an example of a configuration of a demodulation unit of a data carrier driving apparatus.

FIGS. 5A and 5B show examples of correspondence relationships between data values and clock pulse signals transmitted by the data carrier driving apparatus.

FIG. 7 shows an example of signal waveforms corresponding to reply data.

FIG. 9 shows an example of measurement for determination processing performed by a determination unit of the data carrier apparatus.

FIG. 10 shows an example of a waveform of a received pulse signal.

FIG. 14 is a cross-sectional view showing a schematic configuration example of a printer according to a third embodiment.

FIG. 15 is a block diagram showing an example of a control configuration of a printer according to the third embodiment.

DESCRIPTION OF THE EMBODIMENTS

Figure 6:
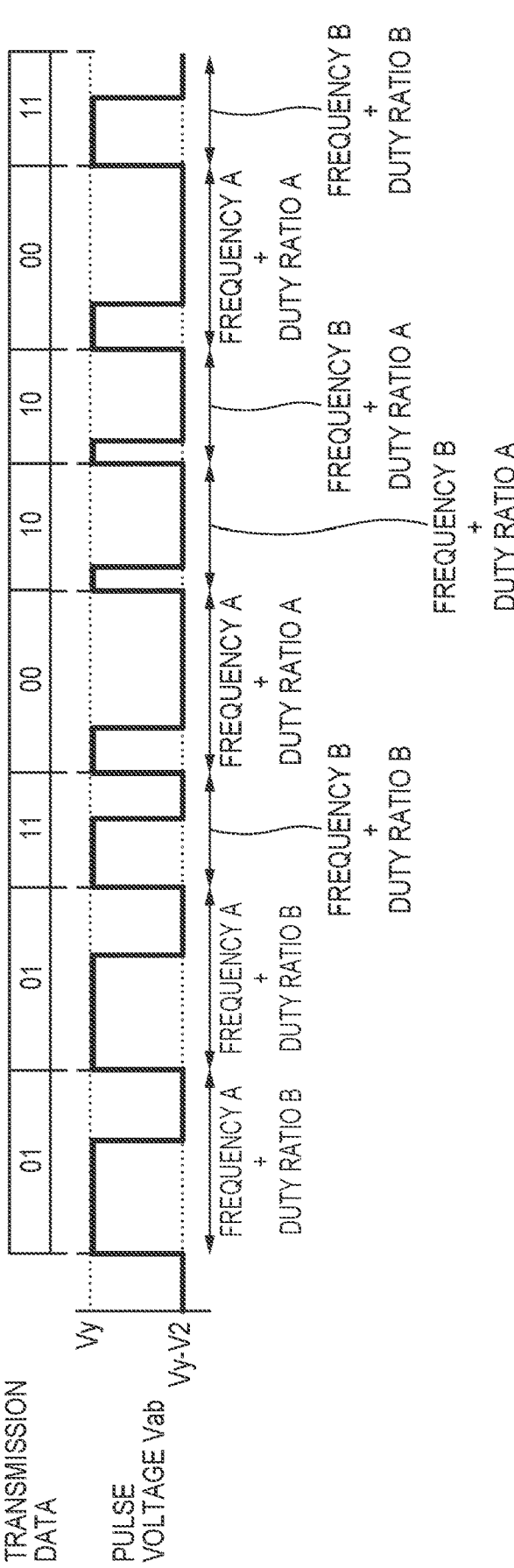
FIG. 6 shows an example of a pulse voltage Vab corresponding to command data.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 shows a configuration example of a data communication system 100 according to a first embodiment of the present disclosure. The data communication system 100 includes a data carrier apparatus 101 and a data carrier driving apparatus 102. The data carrier driving apparatus 102 has a terminal A and a terminal B. The data carrier apparatus 101 has a contact A and a contact B. As shown in FIG. 1, the terminal A and the contact A are connected to each other by a communication line, and the terminal B and the contact B are connected to each other by a communication line, whereby the data carrier apparatus 101 and the data carrier driving apparatus 102 can communicate via these two communication lines. The data carrier apparatus 101 and the data carrier driving apparatus 102 transmit and receive data via two communication lines. The data carrier driving apparatus 102 further supplies power for operation of the data carrier apparatus 101 to the data carrier apparatus 101 via these two communication lines.

The data communication system 100 according to this embodiment is applicable to, for example, an image forming apparatus as exemplified in the third embodiment. Specifically, the data carrier driving apparatus 102 may be provided in the main body of the image forming apparatus, and the data carrier apparatus 101 may be provided in a replaceable unit that can be attached to the image forming apparatus. The image forming apparatus is configured such that when a replaceable unit is attached to the image forming apparatus, the data carrier driving apparatus 102 and the data carrier apparatus 101 are connected to each other by two communication lines and can communicate with each other. The data carrier apparatus 101 is provided with a memory (not shown) in which information is stored. The memory may store information related to the replaceable unit, such as information regarding authentication of the replaceable unit or information regarding control parameters in image formation control performed using the replaceable unit. The image forming apparatus can use the data communication system 100 to acquire information stored in the memory provided in the data carrier apparatus 101.

FIG. 2 shows an example of change in the communication state of the data communication system 100 and a pulse voltage Vab corresponding to each communication state. The data communication system 100 has four communication states (standby state, data transmission state, interval state, and data reply state). As shown in FIG. 2, the data communication system 100 performs data communication while changing communication states in the order of the standby state, the data transmission state, the interval state, and the data reply state.

In the data transmission state, the data carrier driving apparatus 102 transmits command data to the data carrier apparatus 101. For example, the data carrier driving apparatus 102 instructs the data carrier apparatus 101 to read out data stored in a memory (not shown) of the data carrier apparatus 101 using the command data. In the interval state, the data carrier apparatus 101 analyzes the command data received in the data transmission state and executes processing according to the command data. In the data reply state, the data carrier apparatus 101 transmits reply data to the data carrier driving apparatus 102 as a response to the command data received from the data carrier driving apparatus 102 in the data transmission state. For example, in a case where command data received in the data transmission state instructs readout of data stored in the memory, the data stored in the memory is transmitted as reply data. When the data reply state ends, the data communication system 100 transitions to the standby state. The standby state corresponds to a state before the data carrier driving apparatus 102 transmits the next command data to the data carrier apparatus 101.

Data Carrier Driving Apparatus 102

Next, the configuration and operation of the data carrier driving apparatus 102 will be described with reference to FIGS. 1 to 7. FIG. 3 shows an example of a signal waveform in the data communication system 100. FIG. 4 shows a configuration example of a demodulation unit 106 of the data carrier driving apparatus 102.

As shown in FIG. 1, the data carrier driving apparatus 102 includes a first power supply 107 that outputs a voltage V1, and a second power supply 108 that outputs a voltage V2 lower than the voltage V1. The first power supply 107 outputs the voltage V1 to a current detection unit 110 and a threshold setting unit 111 of the demodulation unit 106. The second power supply 108 outputs the voltage V2 to a voltage conversion unit 112. A data processing unit 103 generates command data to be transmitted to the data carrier apparatus 101 and executes processing based on reply data received from the data carrier apparatus 101.

A modulation unit 105 includes a pulse signal generation unit 113, a duty ratio setting unit 114, and a frequency setting unit 115, and generates a clock pulse signal according to the command data generated by the data processing unit 103. The duty ratio setting unit 114 stores values indicating two duty ratios, namely a duty ratio A and a duty ratio B. In this embodiment, it is assumed that the duty ratio A is a duty ratio smaller than 50%, and the duty ratio B is a duty ratio larger than 50%. The duty ratio setting unit 114 selects the duty ratio A or the duty ratio B according to the data value of the command data, and it notifies the pulse signal generation unit 113 of the value indicating the selected duty ratio. The frequency setting unit 115 stores values indicating two frequencies, namely a frequency A and a frequency B. In this embodiment, it is assumed that the frequency B is higher than the frequency A. The frequency setting unit 115 selects the frequency A or the frequency B according to the data value of the command data, and it notifies the pulse signal generation unit 113 of the value indicating the selected frequency.

The pulse signal generation unit 113 generates a clock pulse signal including pulses that are based on the duty ratio and the frequency selected by the duty ratio setting unit 114 and the frequency setting unit 115, respectively, and outputs the generated clock pulse signal to the voltage conversion unit 112. That is, the pulse signal generation unit 113 of this embodiment outputs a clock pulse signal including any of the following four types of pulses:

A pulse with the frequency A and the duty ratio A;

A pulse with the frequency B and the duty ratio A;

A pulse with the frequency A and the duty ratio B; and

A pulse with the frequency B and the duty ratio B.

In this way, the modulation unit 105 generates a pulse signal in which the frequency and the duty ratio (pulse width) of each pulse are modulated based on the data to be transmitted (command data).

The voltage conversion unit 112 outputs, to the terminal B, a voltage V2 output from the second power supply 108 during a period when the level of the input clock pulse signal is a low level (L level). On the other hand, the voltage conversion unit 112 outputs 0 V (GND) to the terminal B during a period when the level of the input clock pulse signal is a high level (H level). For example, when the clock pulse signal shown in FIG. 3 is input from the modulation unit 105 (pulse signal generation unit 113) to the voltage conversion unit 112, the voltage conversion unit 112 outputs a voltage Vb having the waveform shown in FIG. 3 to the terminal B. In this way, the voltage conversion unit 112 changes the potential difference (pulse voltage Vab) provided between the above-described two communication lines by changing the voltage Vb based on the clock pulse signal generated by the modulation unit 105. That is, the voltage conversion unit 112 is configured to transmit the clock pulse signal generated by the modulation unit 105 to the data carrier apparatus 101 based on the potential difference provided between the two communication lines.

The demodulation unit 106 includes a current determination unit 109, a current detection unit 110, and a threshold setting unit 111, demodulates the reply data transmitted from the data carrier apparatus 101 to the data carrier driving apparatus 102, and outputs the demodulation result to the data processing unit 103. As shown in FIG. 4, the current detection unit 110 includes a current detection resistor Ri. Due to a current I flowing from the first power supply 107 to the data carrier apparatus 101 via the current detection unit 110, a voltage drop occurs at the current detection resistor Ri of the current detection unit 110. A voltage Va at the contact A of the data carrier apparatus 101 (the terminal A of the data carrier driving apparatus 102) changes according to the voltage drop (=I×Ri) that occurs in the current detection resistor Ri due to the current I. For example, if the voltage Va is Vy in the case where the value of the current I is Iy, the voltage Va at the contact A (terminal A) of the data carrier apparatus 101 is $$Va = Vy = (V1 - Iy \times Ri)$$

The threshold setting unit 111 has voltage dividing resistors R1 and R2, and it generates a threshold voltage Vth by dividing the voltage V1 output by the first power supply 107 using the voltage dividing resistors R1 and R2. The current determination unit 109 has a comparator to which the threshold voltage Vth and the voltage Va at the terminal A are input. The comparator determines the magnitude of the voltage drop that occurs in the current detection resistor Ri due to the current I by comparing the input voltages, and outputs the determination result to the data processing unit 103.

Note that, as will be described later, in this embodiment, it is the data carrier apparatus 101 that changes the value of the current I. Specifically, the data carrier apparatus 101 sets the value of current I to Iy in a communication state other than the data reply state. Also, in the data reply state, the data carrier apparatus 101 sets the value of the current I to Ix or Iy according to the data value of the reply data, and Ix is set to a value larger than Iy (i.e., Ix>Iy). In the following, the voltage Va is set as Vy in the case where the value of the current I is Iy, and the voltage Va is set as Vx in the case where the value of the current I is Ix. When Ix>Iy holds true, Vx<Vy holds true. Note that Vx>V2 holds true.

FIG. 3 shows, in addition to the waveform of the clock pulse signal output from the modulation unit 105, the waveforms of the voltage Vb at the terminal B, the voltage Va at the terminal A, and the pulse voltage Vab in the case where the value of the current I is Iy. The pulse voltage Vab is a potential difference between the terminal A and the terminal B, and is supplied to the data carrier apparatus 101 via the contact A and the contact B. In the example of FIG. 3, in a case where the value of the current I is Iy, the voltage Va at the terminal A is Vy. The voltage Vb at the terminal B changes between 0 V and V2 in response to the clock pulse signal, as described above. In this case, the waveform of the pulse voltage Vab is a pulse waveform that alternatingly repeats a high level and a low level, the high level being approximately Vy, and the low level being approximately (Vy−V2).

Transmission Processing Performed by Data Carrier Driving Apparatus 102

Next, command data transmission processing performed by the data carrier driving apparatus 102 will be described. When transmitting command data in the data transmission state, the modulation unit 105 of the data carrier driving apparatus 102 generates a clock pulse signal modulated according to the data value of the command data. As described above, the clock pulse signal output by the pulse signal generation unit 113 includes one of four types of pulses corresponding to the combination of the frequency (frequencies A and B) and the duty ratio (duty ratios A and B). In the data transmission state, the data carrier driving apparatus 102 transmits command data, by supplying the pulse voltage Vab corresponding to the clock pulse signal generated by the modulation unit 105 to the data carrier apparatus 101.

As described above, in this embodiment, the value of the current I is constant at Iy in a communication state other than the data reply state (i.e., the standby state, the data transmission state, and the interval state). For this reason, as shown in FIG. 3, in the data transmission state, the waveform of the pulse voltage Vab supplied to the data carrier apparatus 101 is a pulse waveform that alternatingly repeats a high level and a low level, similarly to the clock pulse signal generated by the modulation unit 105. Also, when the clock pulse signal is at a high level, the pulse voltage Vab is the voltage Vy, and when the clock pulse signal is at a low level, the pulse voltage Vab is a voltage (Vy−V2) lower than the voltage Vy.

FIGS. 5A and 5B show examples of the correspondence relationship between the data values and the clock pulse signals transmitted by the data carrier driving apparatus 102. In this embodiment, the data carrier driving apparatus 102 can perform "2-bit transmission" in which a 2-bit data value is transmitted in one cycle of the clock pulse signal, and "1-bit transmission" in which a 1-bit data value is transmitted in one cycle of the clock pulse signal. The data carrier driving apparatus 102 of this embodiment performs 1-bit transmission during some periods and performs 2-bit transmission during other periods.

FIG. 5A shows an example of 2-bit transmission. In 2-bit transmission, 2 bits are transmitted by combining the frequency (frequencies A and B) and the duty ratio (duty ratios A and B) in each cycle of the clock pulse signal. Specifically, the data carrier driving apparatus 102 selects the frequency and the duty ratio corresponding to the 2-bit data value to be transmitted. This selection processing is performed by, for example, the duty ratio setting unit 114 selecting the duty ratio according to the first bit of the 2 bits to be transmitted, and the frequency setting unit 115 selecting the frequency according to the second bit of the 2 bits to be transmitted. The data carrier driving apparatus 102 performs 2-bit transmission to the data carrier apparatus 101 by outputting the pulse voltage Vab modulated according to the selected frequency and duty ratio to the data carrier apparatus 101.

On the other hand, FIG. 5B shows an example of 1-bit transmission. In 1-bit transmission, 1 bit is transmitted in each cycle of the clock pulse signal using only the duty ratio, regardless of the frequency (frequencies A and B). Specifically, the data carrier driving apparatus 102 selects a duty ratio corresponding to a 1-bit data value to be transmitted. This selection processing is performed, for example, by the duty ratio setting unit 114 selecting a duty ratio according to the 1 bit to be transmitted. The data carrier driving apparatus 102 performs 1-bit transmission to the data carrier apparatus 101 by outputting the pulse voltage Vab modulated according to the selected duty ratio to the data carrier apparatus 101.

FIG. 6 shows an example of the pulse voltage Vab corresponding to the command data when the data carrier driving apparatus 102 transmits command data including a data string "0101110010100011" through 2-bit transmission. As shown in FIG. 6, the data carrier driving apparatus 102 outputs the pulse voltage Vab whose duty ratio and frequency are modulated according to data values in units of 2 bits ("00", "01", "10", or "11") to the data carrier apparatus 101. The pulse voltage Vab is applied between the contacts A and B of the data carrier apparatus 101. Also, the data carrier driving apparatus 102 of this embodiment repeatedly outputs a pulse corresponding to the data value "11" in FIGS. 5A and 6 in each cycle of the pulse voltage Vab in a communication state other than the data transmission state. That is, in a communication state other than the data transmission state, the frequency and the duty ratio of the pulse voltage Vab are the frequency B and the duty ratio B, respectively.

Reception Processing Performed by Data Carrier Driving Apparatus 102

Next, reply data reception processing performed by the data carrier driving apparatus 102 will be described. The data carrier apparatus 101 transmits reply data to the data carrier driving apparatus 102 by changing the current I flowing from the data carrier driving apparatus 102. The demodulation unit 106 of the data carrier driving apparatus 102 determines the data value of the reply data by determining the magnitude of the current I.

In this embodiment, in a case where the data value of the reply data is "1", the data carrier apparatus 101 sets the value of the current I to Iy in both the period when the pulse voltage Vab is at a high level and the period when the pulse voltage Vab is at a low level. On the other hand, in a case where data value of the reply data is "0", the data carrier apparatus 101 sets the value of the current I to Ix, which is larger than Iy (Ix>Iy), during the period when the pulse voltage Vab is at a high level, and sets the value of the current I to Iy during the period when the pulse voltage Vab is at a low level. Note that the data carrier apparatus 101 sets the value of the current I to Iy while the reply data is not being transmitted. In this manner, when "0" is transmitted as the data value of the reply data, the data carrier apparatus 101 increases the value of the current I during the period when the pulse voltage Vab is at a high level, compared to other periods.

As described above, in the data carrier driving apparatus 102, the voltage Va at the terminal A changes according to the voltage drop that occurs in the current detection resistor Ri of the current detection unit 110 due to the current I. That is, the voltage Va at the terminal A changes depending on the value of the current I flowing from the data carrier driving apparatus 102 to the data carrier apparatus 101. Here, when the voltages Va are Vx and Vy in the case where the values of the current I are Ix and Iy, respectively (Ix>Iy), Vy>Vx holds true.

In the present embodiment, the threshold setting unit 111 is configured such that the threshold voltage Vth generated by dividing the voltage V1 output from the first power supply 107 satisfies the relationship Vy>Vth>Vx. As shown in FIG. 4, in this embodiment, the threshold voltage Vth is input to the negative terminal of a comparator included in the current determination unit 109, and the voltage Va is input to the positive terminal of the comparator. In a case where the value of the current I is Ix, the voltage Vx is input to the comparator as the voltage Va. As a result, the comparator outputs a low level signal corresponding to the determination result Vth>Vx. On the other hand, in a case where the value of the current I is Iy, the voltage Vy is input to the comparator as the voltage Va. As a result, the comparator outputs a high-level signal corresponding to the determination result Vy>Vth. The output signal of the comparator is input to the data processing unit 103.

Figure 7:
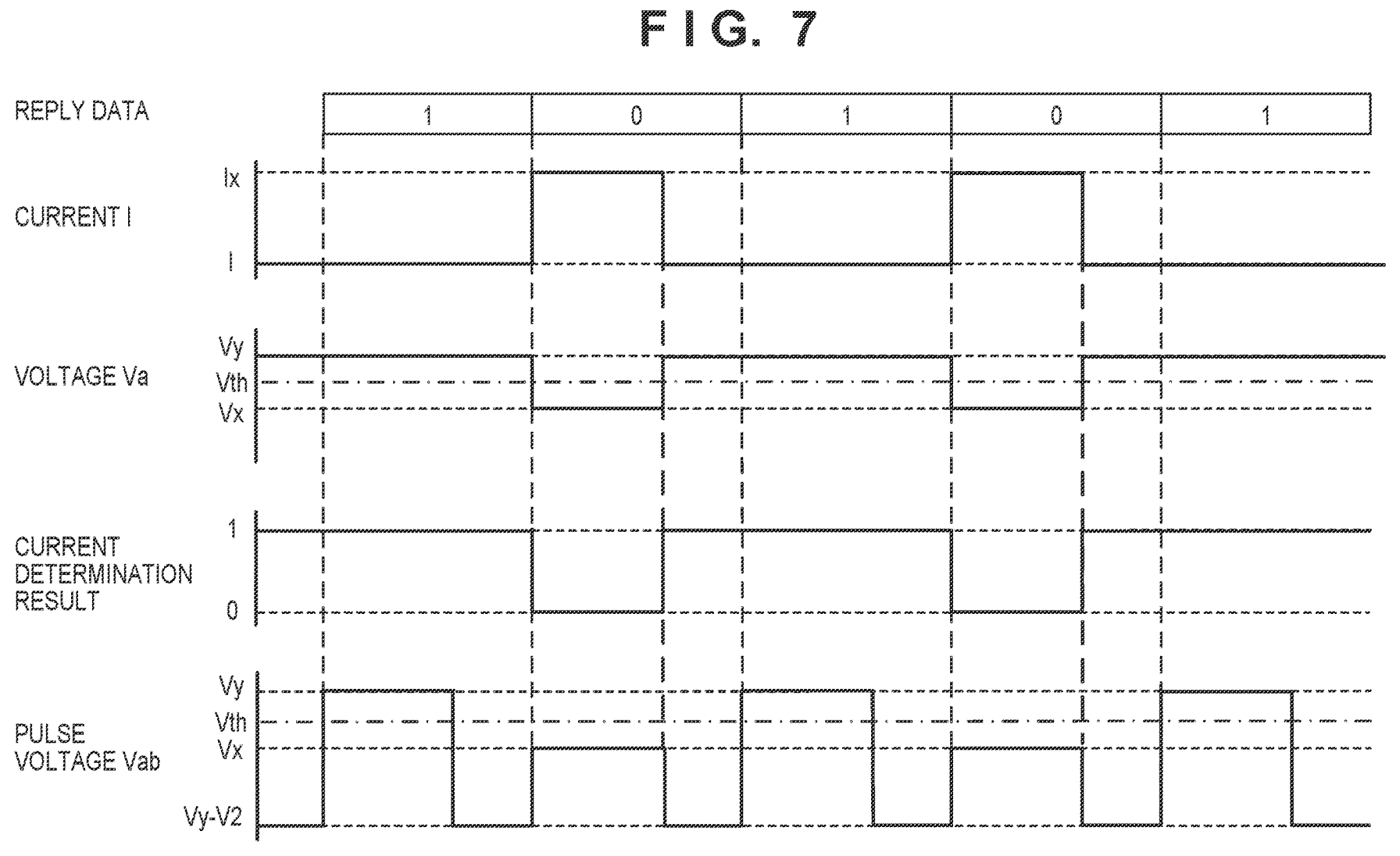

FIG. 7 shows an example of signal waveforms corresponding to the reply data in a case where the data string of the reply data is "10101". As described above, while the current I=Iy holds true, the voltage Va=Vy (>Vth) holds true, and while the current I=Ix holds true, the voltage Va=Vx (<Vth) holds true. The comparator of the current determination unit 109 compares the voltage Va with the threshold voltage Vth, and outputs a signal having a waveform shown as the current determination result in FIG. 7 to the data processing unit 103. The data processing unit 103 determines the data value of the reply data based on the output signal (current determination result) of the comparator in the period from the rising edge of pulse voltage Vab to the next falling edge thereof.

Note that, as shown in FIG. 7, since the value of the voltage Va changes according to the value of the current I, the high-level value of the pulse voltage Vab also changes according to the reply data. The data carrier apparatus 101 keeps the value of the current I constant at Iy in a communication state other than the data reply state. For this reason, as shown in FIG. 2, the high-level value of the pulse voltage Vab changes only during the period of the data reply state.

Data Carrier Apparatus 101

Next, the configuration and operation of the data carrier apparatus 101 will be described with reference to FIG. 1, FIG. 5A, FIG. 5B, FIG. 8, and FIG. 9.

As shown in FIG. 1, the data carrier apparatus 101 includes an internal clock generation unit 116, a switching unit 117, an internal power source generation unit 118, a demodulation unit 122, a data processing unit 123, a conversion unit 124, and a determination unit 125. The internal power source generation unit 118 generates a voltage Vp to be used by the data carrier apparatus 101 based on the pulse voltage Vab supplied from the data carrier driving apparatus 102, and it supplies the voltage Vp to each unit of the data carrier apparatus 101. The conversion unit 124 converts the pulse voltage Vab into a voltage that can be used in logic units within the data carrier apparatus 101. The internal clock generation unit 116 generates an internal clock with a frequency higher than the frequency of the pulse voltage Vab and outputs the internal clock to the determination unit 125.

Reception Processing Performed by Data Carrier Apparatus 101

Figure 8:
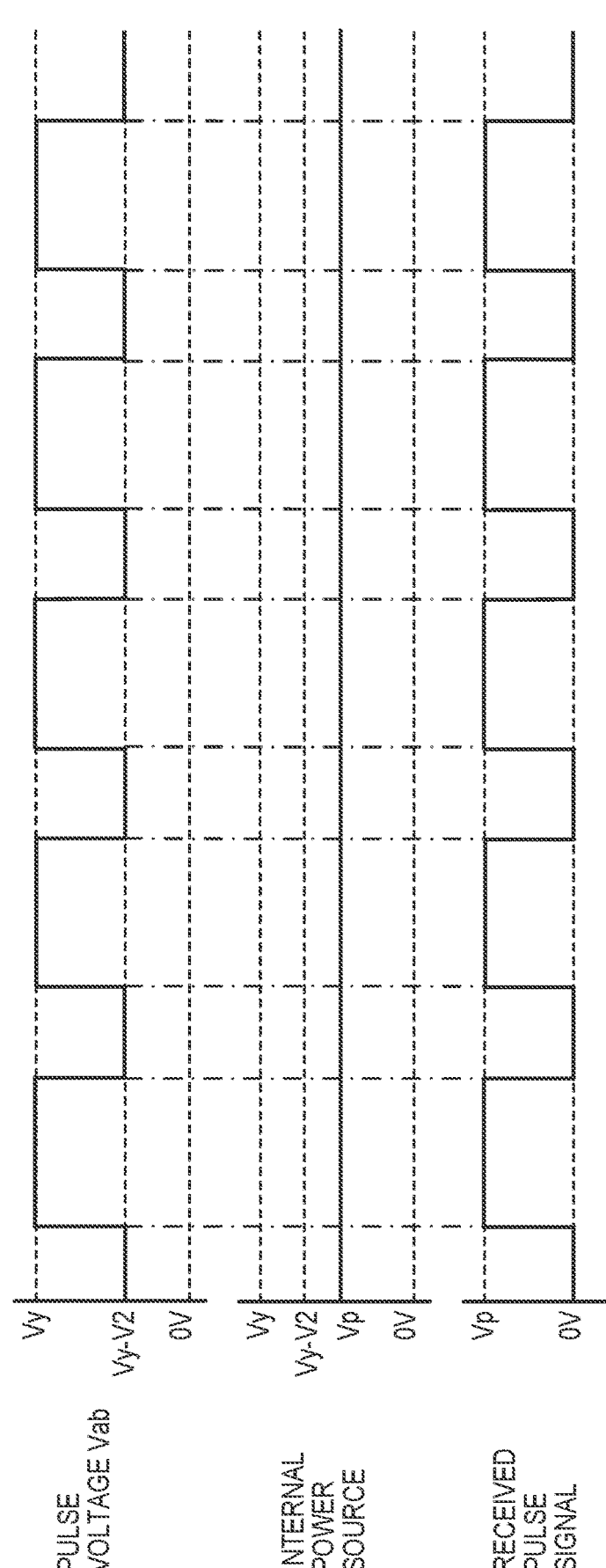
FIG. 8 shows an example of signal waveforms in a data carrier apparatus.

FIG. 8 shows the waveforms of the pulse voltage Vab, the voltage generated by the internal power source generation unit 118, and the received pulse signal output to the determination unit 125 in a case where the value of the current I is Iy. In this embodiment, the conversion unit 124 converts the pulse voltage Vab into the voltage Vp in a case where the pulse voltage Vab is at a high level, and it converts the pulse voltage Vab into a reference voltage that is lower than the voltage Vp in a case where the pulse voltage Vab is at a low level. The conversion unit 124 outputs the converted voltage to the determination unit 125 as a received pulse signal. Note that in this embodiment, the reference voltage is 0 V.

In the data transmission state, the determination unit 125 determines the duty ratio and the frequency of each pulse of the received pulse signal, and outputs the determination result to the demodulation unit 122. The demodulation unit 122 demodulates the data conveyed by the received pulse signal. Specifically, the demodulation unit 122 determines (demodulates) the data value of the command data based on the determination result output from the determination unit 125, and outputs the determined data value to the data processing unit 123. The data processing unit 123 generates reply data based on the content of the command data, and outputs the reply data to the switching unit 117. The switching unit 117 transmits the reply data to the data carrier driving apparatus 102 by changing the current I flowing from the data carrier driving apparatus 102 to the data carrier apparatus 101 according to the data value of the reply data.

The determination unit 125 includes a duty ratio determination unit 120, a frequency determination unit 121, and a reference value setting unit 126. The duty ratio determination unit 120 determines the duty ratio (pulse width) of each pulse of the received pulse signal received from the data carrier driving apparatus 102. In this embodiment, the duty ratio determination unit 120 determines whether the duty ratio of the received pulse signal is the duty ratio A or the duty ratio B. The frequency determination unit 121 determines the frequency of each pulse of the received pulse signal received from the data carrier driving apparatus 102. A reference value X output from the reference value setting unit 126 is used for frequency determination by the frequency determination unit 121. In this embodiment, the frequency determination unit 121 determines whether the frequency of the received pulse signal is the frequency A or the frequency B. In this embodiment, the duty ratio A is set to a duty ratio smaller than 50%, and the duty ratio B is set to a duty ratio larger than 50%. Also, the frequency B is set to a higher frequency than the frequency A.

FIG. 9 shows an example of measurement for determination processing performed by the determination unit 125. For each pulse of the received pulse signal, the determination unit 125 uses an internal clock generated by the internal clock generation unit 116 to measure a high-level period t1 and a period (i.e., the cycle of the pulse) t2 including a high-level period and a low-level period. Specifically, as shown in FIG. 9, the determination unit 125 measures t1 and t2 for each pulse of the received pulse signal as count values obtained by counting the internal clock. Note that t2 is an example of a first period, which is a period from a first edge to the next first edge in which the received pulse signal changes from a first level (low level) to a second level (high level), and t1 is an example of a second period, which is a period during which the second level continues.

For each pulse of the received pulse signal, the duty ratio determination unit 120 determines whether the duty ratio of the target pulse is the duty ratio A or the duty ratio B by determining whether or not t1 is larger than half of t2 based on the measurement results of t1 and t2. Here, the duty ratio A is set to a duty ratio smaller than 50%, the duty ratio B is set to a duty ratio larger than 50%, and t2/2 (half cycle of the pulse) corresponds to a duty ratio of 50%. Accordingly, the duty ratio determination unit 120 determines that the duty ratio of the target pulse is the duty ratio A in a case where t1 is smaller than t2/2, and determines that the duty ratio of the target pulse is the duty ratio B in a case where t1 is larger than t2/2. The duty ratio determination unit 120 outputs the determination result of the duty ratio of the target pulse to the demodulation unit 122.

Also, the frequency determination unit 121 determines whether the frequency of the target pulse is the frequency A or the frequency B by determining whether or not t2 is larger than the reference value X for each pulse of the received pulse signal, based on the measurement result of t2. Here, since the frequency B is set to a higher frequency than the frequency A, t2 (the cycle of the pulse) in the case where the frequency is the frequency A is larger than t2 in the case where the frequency is the frequency B. In this embodiment, the reference value X used by the frequency determination unit 121 is set to a value that is smaller than the cycle of the pulse (t2) corresponding to the frequency A and larger than the cycle of the pulse (t2) corresponding to the frequency B. Accordingly, the frequency determination unit 121 compares t2 and the reference value X, and determines that the frequency of the target pulse is the frequency A in a case where t2 is larger than X, and determines that the frequency of the target pulse is the frequency B in a case where t2 is smaller than X. The frequency determination unit 121 outputs the determination result of the frequency of the target pulse to the demodulation unit 122.

The demodulation unit 122 demodulates the command data based on the determination results of the frequency and the duty ratio, which are output from the frequency determination unit 121 and the duty ratio determination unit 120, respectively. In this embodiment, during the period in which the above-mentioned 2-bit transmission is performed, the demodulation unit 122 performs "2-bit demodulation" in which a 2-bit data value is determined based on the correspondence relationship shown in FIG. 5A, as a demodulation result of the command data. Specifically, as the demodulation result of the command data, "00" is determined for the determination result of the frequency A and the duty ratio A, "01" is determined for the determination result of the frequency A and the duty ratio B, "10" is determined for the determination result of the frequency B and the duty ratio A, and "11" is determined for the determination result of the frequency B and the duty ratio B. The demodulation unit 122 outputs the demodulation result of the command data to the data processing unit 123.

On the other hand, during the period in which the above-mentioned 1-bit transmission is performed, the demodulation unit 122 performs "1-bit demodulation" in which the 1-bit data value is determined based on the correspondence relationship shown in FIG. 5B as the demodulation result of the command data. Specifically, regardless of the frequency, "0" is determined as the demodulation result of the command data for the determination result of the duty ratio A, and "1" is determined as the demodulation result of the command data for the determination result of the duty ratio B. The demodulation unit 122 outputs the demodulation result of the command data to the data processing unit 123, as in the case of 2-bit transmission.

Note that the data communication system 100 of this embodiment performs 1-bit transmission during some periods in the data transmission state, and performs 2-bit transmission during other periods in the data transmission state. The data communication system 100 executes calibration of the reference value X and transmits command data through 1-bit transmission during the calibration period of the reference value X, which will be described later. The data carrier apparatus 101 performs 2-bit demodulation or 1-bit demodulation using the demodulation unit 122, in accordance with 2-bit transmission or 1-bit transmission.

Transmission Processing in Data Carrier Apparatus 101

Next, reply data transmission processing performed by the data carrier apparatus 101 will be described. As described above, when the interval state ends after the data transmission state, the data communication system 100 transitions to the data reply state. In the data reply state, the data carrier apparatus 101 transmits the reply data by changing the magnitude of the current I flowing from the data carrier driving apparatus 102 to the data carrier apparatus 101 according to the reply data.

Specifically, the switching unit 117 of the data carrier apparatus 101 switches the magnitude of the current I by changing the load according to the reply data input from the data processing unit 123. For example, as shown in FIG. 7, in a case where the data value of the reply data is "0", the switching unit 117 changes the load such that the value of the current I is Ix during the period when the pulse voltage Vab is at a high level.

Figure 11:
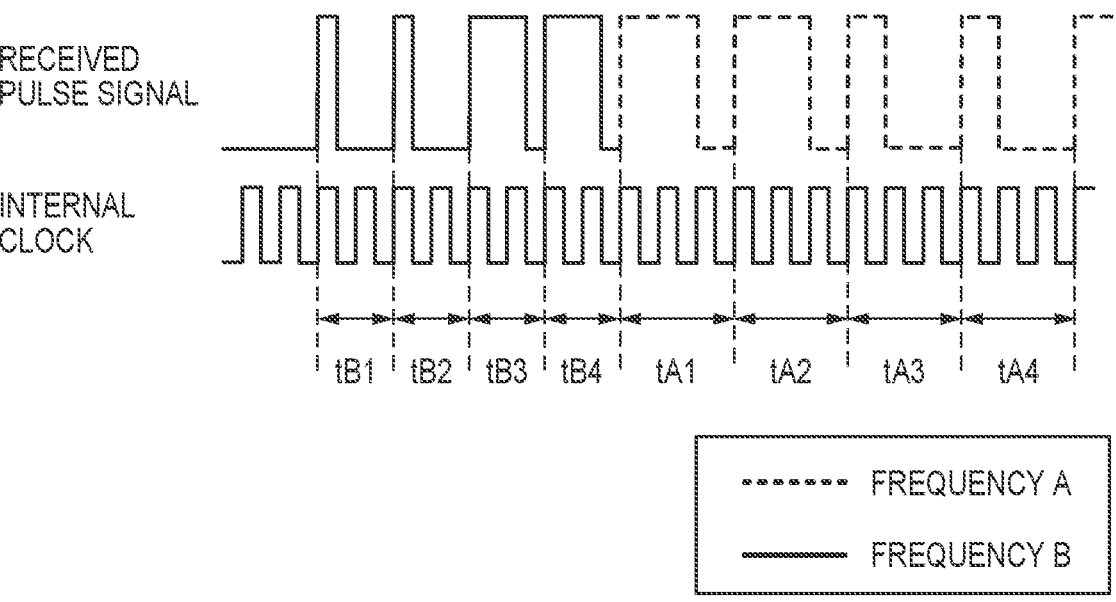
FIG. 11 shows an example of measurement of a received pulse signal.

Calibration of Reference Value X Next, an example of calibration of the reference value X used for pulse frequency determination in the data carrier apparatus 101 will be described with reference to FIGS. 10 and 11. FIG. 10 shows an example of a waveform of the received pulse signal output from the conversion unit 124 to the determination unit 125 in a case where a data string "C303F" (hexadecimal notation) is transmitted from the data carrier driving apparatus 102 to the data carrier apparatus 101. FIG. 11 shows an example of measurement of a received pulse signal for calibration of the reference value X during the calibration period.

In this embodiment, the data communication system 100 uses a portion of the period in the data transmission state as a calibration period for calibrating the reference value X in the data carrier apparatus 101. That is, a portion of the transmission period during which data is transmitted from the data carrier driving apparatus 102 to the data carrier apparatus 101 is used as the calibration period. The data carrier apparatus 101 receives a pulse signal in which the duty ratio of each pulse is modulated based on the data to be transmitted, during the calibration period of the above-mentioned transmission period. Also, the data carrier apparatus 101 receives a pulse signal in which the duty ratio and the frequency of each pulse are modulated based on the data to be transmitted, during another period of the above-mentioned transmission period.

FIGS. 10 and 11 show an example in which the transmission period of the first byte (8 bits) in the data string transmitted from the data carrier driving apparatus 102 is used as the calibration period. During the calibration period, the data communication system 100 calibrates the reference value X in the data carrier apparatus 101 while transmitting command data through 1-bit transmission using the duty ratio of a pulse. In the data carrier apparatus 101, the demodulation unit 122 performs first demodulation (1-bit demodulation) based on the determination result of the duty ratio determination unit 120 during the calibration period, and when the calibration period ends, the demodulation unit 122 starts second demodulation (2-bit demodulation) based on the determination result of the duty ratio determination unit 120 and the determination result of the frequency determination unit 121.

Calibration of the reference value X is performed in the data carrier apparatus 101 by transmitting a pulse signal having a frequency for calibration of the reference value X from the data carrier driving apparatus 102 to the data carrier apparatus 101. Specifically, the pulse signal transmitted during the calibration period is configured to include pulses corresponding to each of the plurality of frequencies to be determined by the frequency determination unit 121 (i.e., pulses of the frequencies A and B, which are two types of pulses for transmission of command data). During the calibration period, the data carrier apparatus 101 calibrates the reference value X for frequency determination while performing 1-bit demodulation based on the determination result of the duty ratio of the pulse, as shown in FIG. 10. The data carrier apparatus 101 performs later-described measurement on the pulses with the frequencies A and B received from the data carrier driving apparatus 102 during the calibration period, and sets (updates) the reference value X based on the result of the measurement.

When the calibration period ends, the data carrier driving apparatus 102 starts transmitting command data through 2-bit transmission using the duty ratio and the frequency of the pulse. On the other hand, the data carrier apparatus 101 demodulates the command data by performing 2-bit demodulation in conjunction with 2-bit transmission. In the data carrier apparatus 101, if the reference value X is set (updated) based on the result of measurement of the received pulse signal in the calibration period, the frequency determination unit 121 determines the frequency of each pulse of the received pulse signal using the updated reference value X.

In the examples of FIGS. 10 and 11, during the calibration period, the frequency B is used for four pulses corresponding to the first four bits in the transmission data string, and the frequency A is used for four pulses corresponding to the subsequent four bits. The reference value setting unit 126 of the data carrier apparatus 101 measures the cycle of each pulse sequentially received from the data carrier driving apparatus 102 using the internal clock generated by the internal clock generation unit 116 during the calibration period. For example, the reference value setting unit 126 measures the cycle of each pulse by measuring the period from a rising edge to the next rising edge of each received pulse signal as a count value obtained by counting the internal clock. In the example of FIG. 11, the measured values of the cycles of the first four pulses corresponding to the frequency B are shown in order as tB1, tB2, tB3, and tB4, and the measured values of the cycles of the subsequent four pulses corresponding to the frequency A are shown in order as tA1, tA2, tA3, and tA4.

The reference value setting unit 126 sets the reference value X based on the above-mentioned measured values (tB1 to tB4, tA1 to tA4) obtained during the calibration period. The reference value X is set such that the pulse frequency can be determined by comparing the reference value X and t2 as described above. In the examples of FIGS. 10 and 11, the reference value X is set such that the cycle of the pulses corresponding to the frequency A and the cycle of the pulses corresponding to the frequency B can be distinguished using the reference value X. For example, the reference value setting unit 126 determines an average value tB_avg of the measured values tB1 to tB4 corresponding to the frequency B and an average value tA_avg of the measured values tA1 to tA4 corresponding to the frequency A. Furthermore, the reference value setting unit 126 sets the intermediate value between the average value tB_avg and the average value tA_avg (i.e., (tB_avg+tA_avg)/2) as the reference value X.

Note that the reference value X may also be calibrated with a method other than the method described above. For example, the reference value X may also be calibrated using only one pulse corresponding to the frequency A and one pulse corresponding to the frequency B.

As described above, the data carrier apparatus 101 includes the duty ratio determination unit 120 (first determination unit) that determines the duty ratio of each pulse of a received pulse signal that has been received from the data carrier driving apparatus 102, and the frequency determination unit 121 (second determination unit) that determines the frequency of each pulse of the received pulse signal. The reference value setting unit 126 (calibration unit) calibrates the reference value X used for determination by the frequency determination unit 121 during the calibration period. The demodulation unit 122, that demodulates the data conveyed by the received pulse signal, performs first demodulation based on the determination result of the duty ratio determination unit 120 during the calibration period. When the calibration period ends, the demodulation unit 122 starts second demodulation based on the determination result of the duty ratio determination unit 120 and the determination result of the frequency determination unit 121.

In one aspect of this embodiment, the reference value setting unit 126 measures the received pulse signal during the calibration period, and updates the reference value X based on the measurement result. When the reference value X is updated, the frequency determination unit 121 uses the updated reference value X to determine the frequency of each pulse of the received pulse signal.

In this manner, in the data communication system 100 of this embodiment, the calibration period is not provided before the start of data communication, but is provided within the period during which data communication is performed. During the calibration period, the data carrier apparatus 101 performs 1-bit demodulation (first demodulation) based on the duty ratio of each pulse of the received pulse signal, and performs calibration of the reference value X for frequency determination of each pulse of the received pulse signal. In this way, according to the present embodiment, it becomes possible to calibrate the reference value X without providing a calibration period before starting data communication. Accordingly, in a case where data communication is performed using a pulse signal whose duty ratio (pulse width) and frequency are modulated, it is possible to start data communication earlier while realizing stable frequency determination on the receiving side.

Also, by calibrating and updating the reference value X for each data communication, frequency determination can be executed with stable accuracy even if changes in the frequency of the oscillation source (oscillator) within the data carrier apparatus 101 occur due to environmental changes such as temperature changes.

Note that in this embodiment, a pulse signal in which the frequency and duty ratio of each pulse are each modulated with a 1-bit data value is transmitted and received, and one reference value X is used, but the number of bits of the data value used for modulation of the frequency and duty ratio of each pulse may also be increased. For example, in a case of modulating the frequency of each pulse with a 2-bit data value, it is sufficient to provide four different frequencies, and in a case of modulating the duty ratio of each pulse with a 2-bit data value, it is sufficient to provide four different duty ratios. In this case, three reference values need only be set as reference values for frequency determination such that the four frequencies can be distinguished from each other. This makes it possible to transmit and receive pulse signals modulated with more multivalued data values.

Second Embodiment

Next, the second embodiment will be described focusing on the differences from the first embodiment.

Figure 12:
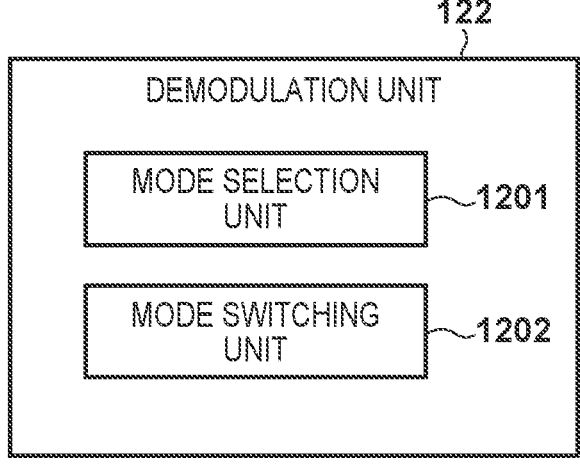
FIG. 12 shows a configuration example of a demodulation unit of a data carrier apparatus according to a second embodiment.

A data communication system 100 according to this embodiment has a configuration similar to that of the first embodiment (FIG. 1). However, the demodulation unit 122 of the data carrier apparatus 101 according to this embodiment includes a mode selection unit 1201 and a mode switching unit 1202, as shown in FIG. 12.

The demodulation unit 122 of this embodiment includes a 1-bit demodulation mode (first demodulation mode) and a 2-bit demodulation mode (second demodulation mode) as operation modes (demodulation modes) for demodulating the data received from the data carrier driving apparatus 102. The 1-bit demodulation mode is a demodulation mode in which the above-mentioned 1-bit demodulation (first demodulation) is performed, and the 2-bit demodulation mode is a demodulation mode in which the above-mentioned 2-bit demodulation (second demodulation) is performed. In 1-bit demodulation, a 1-bit data value is determined based on the determination result of the duty ratio of each pulse in the received pulse signal. In 2-bit demodulation, a 2-bit data value is determined based on the determination result of the frequency and the duty ratio of each pulse in the received pulse signal.

The mode selection unit 1201 holds two predetermined pieces of pattern data corresponding to the 1-bit demodulation mode and the 2-bit demodulation mode, respectively. In this embodiment, each of the two pieces of pattern data is constituted by a 1-byte (8-bit) bit pattern. During the pattern data transmission period (specific period), the pattern data is received as a pulse signal in which the duty ratio of the pulse is sequentially modulated based on each bit of the bit pattern. As an example, these two pieces of pattern data are constituted by "0F" and "33" (hexadecimal notation), where "0F" is an example of pattern data corresponding to the 2-bit demodulation mode, and "33" is an example of pattern data corresponding to the 1-bit demodulation mode.

The mode selection unit 1201 selects a demodulation mode to be used for demodulating command data received from the data carrier driving apparatus 102, from the 1-bit demodulation mode and the 2-bit demodulation mode. The mode selection unit 1201 selects the demodulation mode based on the pattern data received from the data carrier driving apparatus 102. Specifically, the data carrier driving apparatus 102 selects the 2-bit demodulation mode if the received pattern data is "0F", and selects the 1-bit demodulation mode if the received pattern data is "33". The mode switching unit 1202 switches the demodulation mode to be used in the demodulation unit 122 according to the selection result by the mode selection unit 1201. As a result, the demodulation unit 122 demodulates the command data using the demodulation mode selected by the mode selection unit 1201.

Note that in a case of performing 2-bit transmission in the data transmission state, the data carrier driving apparatus 102 transmits pattern data ("0F" in this embodiment) indicating the 2-bit demodulation mode. On the other hand, in a case of performing 1-bit transmission in the data transmission state, the data carrier driving apparatus 102 transmits pattern data ("33" in this embodiment) indicating the 1-bit demodulation mode. In this way, the pattern data received from the data carrier driving apparatus 102 indicates the demodulation mode to be used by the data carrier apparatus 101 in correspondence with the transmission scheme (1-bit transmission or 2-bit transmission) used by the data carrier driving apparatus 102.

In the data communication system 100 of this embodiment, pattern data is transmitted from the data carrier driving apparatus 102 to the data carrier apparatus 101 at the beginning of a transmission period in which data is transmitted from the data carrier driving apparatus 102 to the data carrier apparatus 101. Specifically, the above pattern data is placed in the first byte (hereinafter also referred to as the "start byte") of the data string transmitted from the data carrier driving apparatus 102. The pattern data placed in the start byte of the data string indicates the demodulation mode to be used for demodulating the subsequent received data. The pattern data is transmitted from the data carrier driving apparatus 102 to the data carrier apparatus 101 through 1-bit transmission using the duty ratio of the pulse (that is, using a pulse whose duty ratio is modulated).

In the data carrier apparatus 101, the demodulation mode of the demodulation unit 122 can be set to the 1-bit demodulation mode by the mode switching unit 1202 before the start of the data transmission state such that the pattern data transmitted through 1-bit transmission can be demodulated. As a result, the demodulation unit 122 demodulates the pattern data through 1-bit demodulation.

In the data transmission state, the demodulation unit 122 first demodulates the start byte (the first byte). Specifically, the demodulation unit 122 sequentially demodulates the 1-byte pattern data based on the determination result of the duty ratios of the pulses during the transmission period (specific period) of the start byte in the data string transmitted from the data carrier driving apparatus 102. The mode selection unit 1201 selects the demodulation mode (2-bit demodulation mode or 1-bit demodulation mode) to be applied to the subsequent received data, based on the demodulated pattern data. Note that if the demodulated pattern data does not correspond to either the 2-bit demodulation mode or the 1-bit demodulation mode (in this embodiment, if the demodulated pattern data is other than "0F" and "33"), the demodulation unit 122 may determine that the correct data has not been transmitted and may stop receiving (demodulating) the data.

Processing in 2-Bit Demodulation Mode

Figure 13:
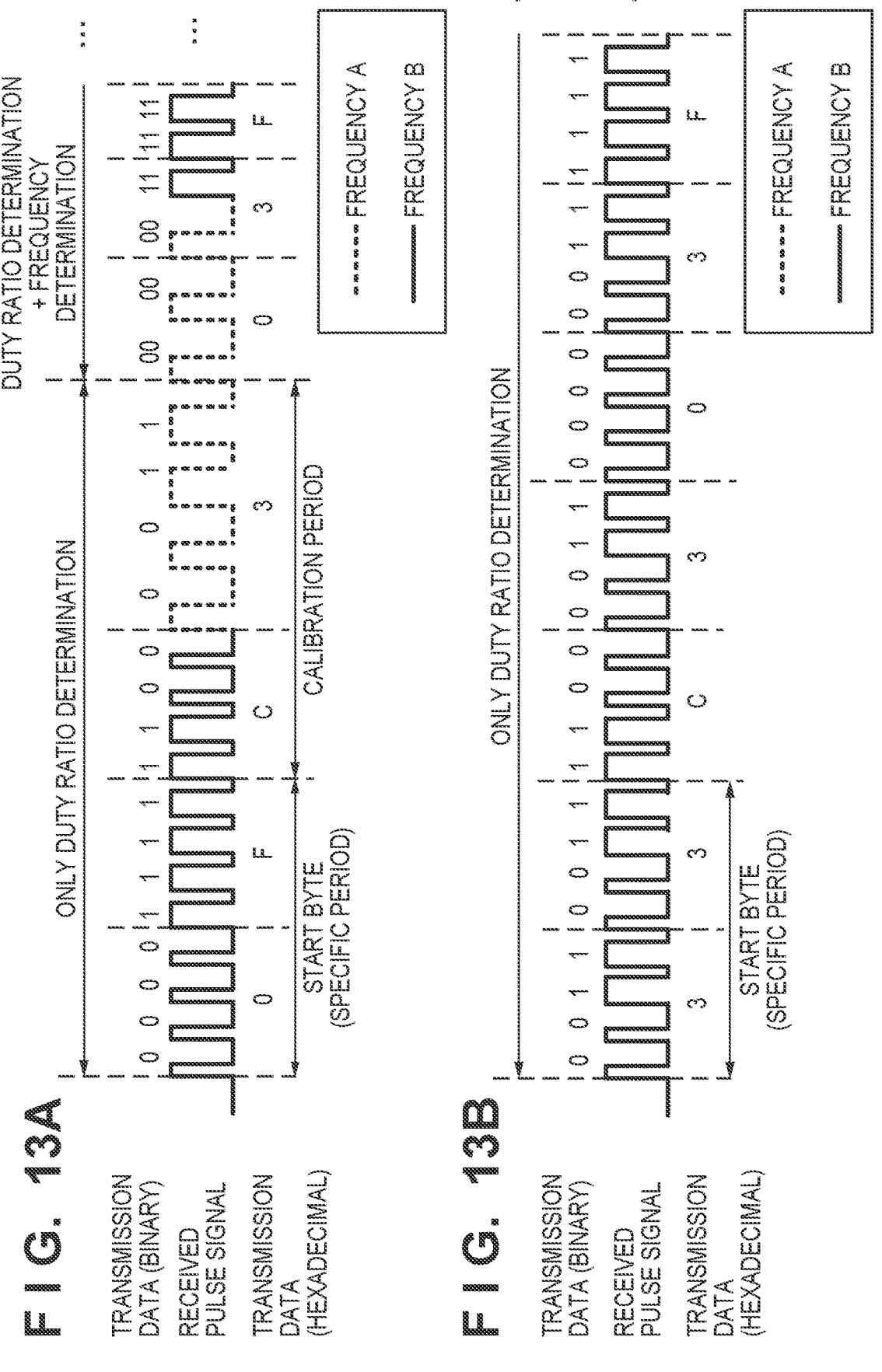
FIGS. 13A and 13B show examples of a waveform of a received pulse signal according to the second embodiment.

FIG. 13A shows an example of the waveform of a received pulse signal output from the conversion unit 124 to the determination unit 125 in a case where the 2-bit demodulation mode is applied. In this example, the data carrier driving apparatus 102 transmits the pattern data "0F" indicating the 2-bit demodulation mode as the start byte, and transmits "C303F . . . " as the subsequent data. In this example, by demodulating the pattern data "0F", the mode selection unit 1201 selects the 2-bit demodulation mode, and outputs the selection result to the mode switching unit 1202.

In a case where 2-bit transmission is used as the transmission method in the data communication system 100 of this embodiment, the transmission period of the 1 byte subsequent to the start byte is used as the calibration period for the reference value X for frequency determination, as shown in FIG. 13A. The operation of the data communication system 100 (data carrier driving apparatus 102 and data carrier apparatus 101) during the calibration period is the same as in the first embodiment. During the calibration period, the data carrier apparatus 101 calibrates the reference value X while performing 1-bit demodulation based on the determination result of the duty ratio of the pulse, as in the first embodiment.

If the 2-bit demodulation mode is selected, the mode switching unit 1202 switches the demodulation mode from the 1-bit demodulation mode to the 2-bit demodulation mode when the calibration period ends. As a result, as shown in FIG. 13A, regarding the data received thereafter, the demodulation unit 122 demodulates the data (command data) based on the determination results of the frequency and the duty ratio, which are respectively output from the frequency determination unit 121 and the duty ratio determination unit 120. The set reference value X is used for frequency determination by the frequency determination unit 121.

Processing in 1-Bit Demodulation Mode

FIG. 13B shows an example of the waveform of the received pulse signal output from the conversion unit 124 to the determination unit 125 in a case where the 1-bit demodulation mode is applied. In this example, the data carrier driving apparatus 102 transmits the pattern data "33" indicating the 1-bit demodulation mode as the start byte, and transmits "C303F . . . " as the subsequent data. In this example, by demodulating the pattern data "33", the mode selection unit 1201 selects the 1-bit demodulation mode, and outputs the selection result to the mode switching unit 1202.

In a case where 1-bit transmission is used as the transmission method in the data communication system 100 of this embodiment, unlike the case of 2-bit transmission, no calibration period is provided. The data carrier driving apparatus 102 continues 1-bit transmission using the duty ratios of the pulses in the period after the start byte. On the other hand, in the data carrier apparatus 101, if the 1-bit demodulation mode is selected, the mode switching unit 1202 continues the 1-bit demodulation mode without switching the demodulation mode to the 2-bit demodulation mode. As a result, as shown in FIG. 13B, the demodulation unit 122 demodulates the received data through 1-bit demodulation based on the determination result of the duty ratios of the pulses in the period after the start byte.

As described above, in the data carrier apparatus 101 of the present embodiment, the demodulation unit 122 further selects the demodulation mode (1-bit demodulation mode) for demodulation performed by the demodulation unit 122, from the first demodulation mode (1-bit demodulation mode) and the second demodulation mode (2-bit demodulation mode), based on pattern data received from the data carrier driving apparatus 102 at the beginning of the transmission period during which data is transmitted from the data carrier driving apparatus 102 to the data carrier apparatus 101. In a case where the pattern data corresponds to the second demodulation mode, a calibration period is provided following the specific period during which the pattern data is transmitted. If the first demodulation mode is selected, the demodulation unit 122 performs first demodulation in the period subsequent to the specific period. On the other hand, if the second demodulation mode is selected, the demodulation unit 122 performs first demodulation in the calibration period provided subsequent to the specific period, and performs second demodulation in the period subsequent to the calibration period.

According to the configuration of the data communication system 100 of this embodiment, for example, even if an old type of data carrier apparatus that does not have a 2-bit demodulation function is connected to the data carrier driving apparatus 102, it is possible to realize data communication in the 1-bit demodulation mode. That is, it is possible to ensure backward compatibility for data communication with such old type of data carrier apparatuses.

Third Embodiment

The data communication systems 100 of the first and second embodiments described above are applicable to, for example, an image forming apparatus. In that case, a configuration may be applied in which the data carrier driving apparatus 102 is mounted on the main body side of the image forming apparatus, and the data carrier apparatus 101 is mounted on a replaceable component such as a consumable item. Hereinafter, a configuration example of an image forming apparatus to which the data communication systems of the first and second embodiments described above are applied will be described.

FIG. 14 is a cross-sectional view showing a schematic configuration example of a printer 300 as an example of the image forming apparatus of this embodiment. The printer 300 is configured as an electrophotographic laser beam printer. The printer 300 includes a photosensitive drum 311, a charging unit 317, and a developing unit 312, as an image forming unit. The photosensitive drum 311 is an example of an image carrier on which an electrostatic latent image is formed. The charging unit 317 uniformly charges the photosensitive drum 311. The developing unit 312 forms a toner image on the photosensitive drum 311 by developing the electrostatic latent image formed on the photosensitive drum 311 with toner. The photosensitive drum 311, the charging unit 317, and the developing unit 312 can be attached to and detached from the main body of the image forming apparatus as an integrated cartridge C. A fixing device 314 fixes the toner image transferred to a sheet onto the sheet. The sheet that has passed through the fixing device 314 is discharged onto a tray 315.

The printer 300 further includes a controller 320 including a CPU for controlling the image forming operations described above. The controller 320 includes a memory (ROM, RAM, etc.) that stores programs for controlling the operations of the printer 300 and data used to execute the programs.

FIG. 15 is a block diagram showing an example of a control configuration in the case where a data communication system is applied to the printer 300. The main body of the printer 300 includes a data carrier driving apparatus 102 that can communicate bidirectionally with the controller 320. The cartridge C includes a data carrier apparatus 101 and a data storage unit 101A. The data carrier apparatus 101 controls the readout and writing of data in the data storage unit 101A. As the data storage unit 101A, a nonvolatile memory such as an EEPROM can be used.

The data carrier driving apparatus 102 executes data communication with the data carrier apparatus 101 mounted on the cartridge C based on commands from the controller 320. The data carrier apparatus 101 of the cartridge C can, for example, process data transmitted from the data carrier driving apparatus 102 and store the processed data in the data storage unit 101A. Also, the data carrier apparatus 101 can read out data stored in the data storage unit 101A based on a signal from the data carrier driving apparatus 102 and transmit the data as reply data to the data carrier driving apparatus 102.

In this way, the above-described embodiments are applicable to a data communication system in which the data carrier apparatus 101 is mounted as a replaceable component (replaceable unit) of an image forming apparatus (printer 300). By storing data regarding a cartridge serving as a consumable of the image forming apparatus in the data storage unit 101A, it is possible to provide a system for managing, for example, the usage status of the cartridge, such as the remaining amount of toner and the usage amount of the photosensitive drum.

Note that the above-described embodiment is not limited to the image forming apparatus (printer 300) illustrated in FIG. 14, but is also applicable to, for example, a color image forming apparatus including a plurality of image forming units. Also, the replaceable component (replaceable unit) on which the data carrier apparatus 101 is provided is not limited to a cartridge. For example, it is possible to provide a data communication system by providing the data carrier apparatus 101 in various replaceable components, including process members used for image formation, such as an intermediate transfer belt unit including an intermediate transfer belt to which the toner image on the photosensitive drum 311 is transferred, or a toner unit containing toner.

According to the present disclosure, in cases of performing multi-value data communication using a pulse signal whose duty ratio (pulse width) and frequency are modulated, data communication can be started earlier while realizing stable frequency determination on the receiving side.

Other Embodiments

Embodiment(s) of the present invention can also be realized by a computer of a system or apparatus that reads out and executes computer executable instructions (e.g., one or more programs) recorded on a storage medium (which may also be referred to more fully as a "non-transitory computer-readable storage medium") to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-204633, filed Dec. 21, 2022, which is hereby incorporated by reference herein in its entirety.

What is claimed is:

1. A data carrier apparatus capable of communicating with a data carrier driving apparatus, comprising:

a first determination unit configured to determine a duty ratio of each pulse of a pulse signal received from the data carrier driving apparatus;

a second determination unit configured to determine a frequency of each pulse of the received pulse signal;

a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends.

2. The data carrier apparatus according to claim 1, wherein the calibration unit performs measurement on the received pulse signal during the calibration period and updates the reference value based on a result of the measurement, and in a case where the reference value is updated, the second determination unit determines the frequency of each pulse of the received pulse signal using the updated reference value.

3. The data carrier apparatus according to claim 2, wherein the calibration unit updates the reference value based on a measured value obtained by measuring a cycle of each pulse of the received pulse signal.

4. The data carrier apparatus according to claim 3, wherein the calibration unit measures the cycle of each pulse of the received pulse signal by sequentially measuring a period from a first edge that changes from a first level to a second level to the next first edge in the received pulse signal.

5. The data carrier apparatus according to claim 3, wherein the received pulse signal includes pulses corresponding to a respective plurality of frequencies to be determined by the second determination unit in the calibration period, and the calibration unit updates the reference value based on measured values corresponding to the respective plurality of frequencies.

6. The data carrier apparatus according to claim 1, wherein a portion of a transmission period during which data is transmitted from the data carrier driving apparatus to the data carrier apparatus is used as the calibration period, and a pulse signal in which the duty ratio of each pulse is modulated based on data to be transmitted is received during the calibration period of the transmission period, and a pulse signal in which the duty ratio and the frequency of each pulse are modulated based on data to be transmitted is received during another period of the transmission period.

7. The data carrier apparatus according to claim 6, wherein the calibration period is provided at a beginning of the transmission period, and when the transmission period is started, the demodulation unit performs the first demodulation during the calibration period, and the demodulation unit starts the second demodulation when the calibration period ends.

8. The data carrier apparatus according to claim 6, wherein the demodulation unit further selects a demodulation mode for demodulation performed by the demodulation unit from a first demodulation mode and a second demodulation mode, based on pattern data received from the data carrier driving apparatus at a beginning of the transmission period, if the pattern data corresponds to the second demodulation mode, the calibration period is provided subsequent to a specific period during which the pattern data is transmitted, if the first demodulation mode is selected, the demodulation unit performs the first demodulation during a period subsequent to the specific period, and if the second demodulation mode is selected, the demodulation unit performs the first demodulation during the calibration period provided subsequent to the specific period, and performs the second demodulation during a period subsequent to the calibration period.

9. The data carrier apparatus according to claim 8, wherein the pattern data is transmitted from the data carrier driving apparatus using the duty ratio of each pulse of a pulse signal during the specific period, and the demodulation unit demodulates the pattern data from the received pulse signal through the first demodulation during the specific period.

10. The data carrier apparatus according to claim 9, wherein the pattern data is constituted by a 1-byte bit pattern, and in the specific period, the pattern data is received as a pulse signal in which duty ratios of pulses are sequentially modulated based on each bit of the bit pattern.

11. The data carrier apparatus according to claim 1, wherein in the first demodulation, the demodulation unit determines a data value corresponding to a determination result of the duty ratio of each pulse by the first determination unit, and in the second demodulation, the demodulation unit determines a data value corresponding to a determination result of the duty ratio of each pulse by the first determination unit, and a data value corresponding to a determination result of the frequency of each pulse by the second determination unit.

12. The data carrier apparatus according to claim 1, wherein the first determination unit determines the duty ratio of each pulse of the received pulse signal based on measurement results of a first period, which is a period from a first edge that changes from a first level to a second level until the next first edge in the received pulse signal, and a second period, which is a period during which the second level continues.

13. The data carrier apparatus according to claim 12, wherein, for each pulse of the received pulse signal, the first determination unit determines whether the duty ratio of the pulse is a first duty ratio or a second duty ratio that is larger than the first duty ratio, by comparing half of the first period with the second period.

14. The data carrier apparatus according to claim 1, wherein the second determination unit determines the frequency of each pulse of the received pulse signal based on measurement results of a first period, which is a period from a first edge that changes from a first level to a second level until the next first edge in the received pulse signal, and the reference value.

15. The data carrier apparatus according to claim 14, wherein the second determination unit determines whether the frequency of each pulse of the received pulse signal is a first frequency or a second frequency that is higher than the first frequency, by comparing the first period with the reference value.

16. The data carrier apparatus according to claim 1, wherein the data carrier apparatus is connected to the data carrier driving apparatus by two communication lines, and receives a pulse signal from the data carrier driving apparatus based on a potential difference provided by the data carrier driving apparatus between the two communication lines.

17. A replaceable unit that is attachable to an image forming apparatus, comprising:

a process member to be used for image formation, a data carrier apparatus capable of communicating with a data carrier driving apparatus provided in the image forming apparatus, when attached to the image forming apparatus, wherein the data carrier apparatus comprises:

a first determination unit configured to determine a duty ratio of each pulse of a pulse signal received from the data carrier driving apparatus;

a second determination unit configured to determine a frequency of each pulse of the received pulse signal;

a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends.

18. A communication system comprising: a data carrier apparatus; and a data carrier driving apparatus to be connected to the data carrier apparatus by two communication lines, wherein the data carrier driving apparatus includes:

a modulation unit configured to generate a pulse signal modulated based on data to be transmitted; and a transmission unit configured to transmit the pulse signal generated by the modulation unit to the data carrier apparatus based on a potential difference provided between the two communication lines, the data carrier apparatus comprises:

a first determination unit configured to determine a duty ratio of each pulse of a pulse signal received from the data carrier driving apparatus;

a second determination unit configured to determine a frequency of each pulse of the received pulse signal;

a calibration unit configured to perform calibration of a reference value to be used for determination performed by the second determination unit, during a calibration period; and a demodulation unit configured to demodulate data conveyed by the received pulse signal, the demodulation unit being configured to perform first demodulation based on a determination result of the first determination unit during the calibration period, and start second demodulation based on the determination result of the first determination unit and a determination result of the second determination unit when the calibration period ends, and the modulation unit generates a pulse signal in which the duty ratio of each pulse is modulated based on data to be transmitted during the calibration period, and the modulation unit starts generation of a pulse signal in which the duty ratio and the frequency of each pulse is modulated based on data to be transmitted when the calibration period ends.

19. The communication system according to claim 18, wherein during the calibration period, the modulation unit generates a pulse signal in which the duty ratio of each pulse is modulated based on data to be transmitted and each pulse has a frequency for calibration of the reference value.

20. The communication system according to claim 18, wherein the data carrier driving apparatus is provided in a main body of an image forming apparatus, and the data carrier apparatus is provided in a replaceable unit of the image forming apparatus.

* * * * *